United States Patent
Suzuki et al.

(10) Patent No.: US 7,817,691 B2
(45) Date of Patent: Oct. 19, 2010

(54) LIGHT EMITTING DEVICE

(75) Inventors: Naofumi Suzuki, Tokyo (JP); Kimiyoshi Fukatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 105 days.

(21) Appl. No.: 12/301,332

(22) PCT Filed: May 17, 2007

(86) PCT No.: PCT/JP2007/000532

§ 371 (c)(1),
(2), (4) Date: Nov. 18, 2008

(87) PCT Pub. No.: WO2007/135772

PCT Pub. Date: Nov. 29, 2007

(65) Prior Publication Data

US 2009/0196317 A1    Aug. 6, 2009

(30) Foreign Application Priority Data

May 19, 2006  (JP) ............................. 2006-139764

(51) Int. Cl.
*H01S 5/00* (2006.01)
(52) U.S. Cl. .................. 372/45.01; 372/44.01
(58) Field of Classification Search .............. 372/44.01, 372/45.01
See application file for complete search history.

(56) References Cited

U.S. PATENT DOCUMENTS 4,567,060 A   1/1986   Hayakawa et al.
5,583,878 A   12/1996  Shimizu et al.
6,515,308 B1  2/2003   Kneissl et al.
2004/0066818 A1  4/2004  Yamamoto et al.

FOREIGN PATENT DOCUMENTS

| JP | 60-110188 | 6/1985 |
|----|-----------|--------|
| JP | 7-74431 | 3/1995 |
| JP | 10-190121 | 7/1998 |
| JP | 2001-345518 | 12/2001 |
| JP | 2003-298187 | 10/2003 |
| JP | 2004-39747 | 2/2004 |

(Continued)

OTHER PUBLICATIONS

Ortsiefer et al., "Low-resistance in Ga(Al)As Tunnel Junctions for Long Wavelength Vertical-cavity Surface-emitting Lasers" Jpn. J. Phys. vol. 39 (2000) pp. 1727-1729, Part 1, No. 4A, Apr. 2000, The Japan Society of Applied Physics 2000.

(Continued)

*Primary Examiner*—Armando Rodriguez
(74) *Attorney, Agent, or Firm*—Young & Thompson

(57) ABSTRACT

It is enabled to provide that a light emitting device have an electron blocking layer (106) positioned between tunnel junctions (107, 108) and an active layer (104). The electron blocking layer (106) has an energy of conduction band edge higher than that of the active layer (605), and is composed of a material containing substantially no aluminum. It suppresses leakage of electrons from an n-type layer through a p-layer to an n-type layer. It is also enabled to provide that a light emitting device is capable of preventing the electron blocking layer (106) from being oxidized in the process of manufacturing by using a layer containing no aluminum for the electron blocking layer (106).

10 Claims, 12 Drawing Sheets

FOREIGN PATENT DOCUMENTS

JP        2005-260044        9/2005

OTHER PUBLICATIONS

Shau et al., "InP-based vertical-cavity surface-emitting lasers for 1.5-1.8 um wavelength range"., pp. 153-154.

Sekiguchi et al., "Selectively Formed AlAs/InP Current Confining Tunnel Junction for GaInAsP/InP Surface Emitting Lasers"., $11^{TH}$ International Conference on Indium Phosphide and Related Materials May 16-20, 1999 Davos, Switzerland.

Wierer et al., "Lateral electron current operation of vertical cavity surface emitting lasers with buried tunnel contact hole sources"., 3468 Appl. Phys. Lett 71 (24) Dec. 15, 1997.

(a)          (b)

FIG. 8
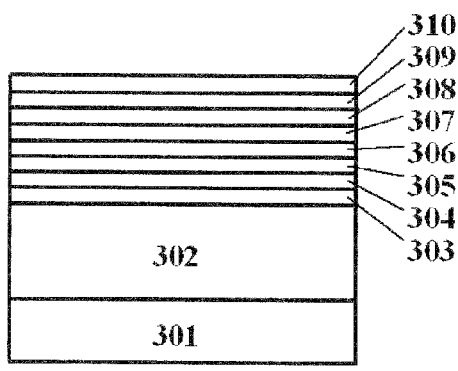
(a)
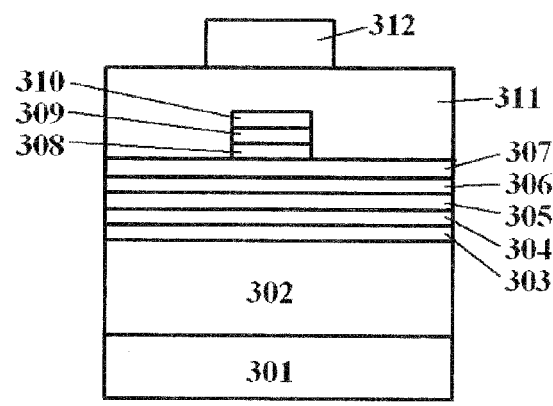
(b)

LIGHT EMITTING DEVICE

TECHNICAL FIELD

The present invention relates to a light emitting device used in the field of optical communication and optical interconnection, and in particular to a light emitting device having a tunnel junction structure.

BACKGROUND ART

Optical communication has widely been put into practical use since a long time ago, particularly in the field of long-distance communication, due to its ability of transmission over long distance with large capacity. Semiconductor laser has generally been used as a light source of transmitter in optical communication.

It is desirable to suppress electric resistance of the semiconductor laser, because it increase power consumption and heat generation. The heat degrades characteristics and lifetime of the device, and may even degrade speed of modulation. In particular, VCSEL (Vertical Cavity Surface Emitting Laser), a kind of surface emitting laser, shows large resistivity due to its small areas of electrodes and active layer, and also shows large thermal resistivity. Therefore, influences of the heat generation become large, which limit output and modulation speed of the device.

On the other hand, semiconductor lasers having large length of resonator, such as excitation lasers, are relatively small in resistance, but are large in operation current and consequently large in heat generation, which causes saturation of output. Therefore, further reduction in the resistivity is desired. It is effective to increase area through which current can pass for reducing the resistivity. Thus, efforts have been made on reducing the resistivity by increasing width of current aperture or width of active layer stripe.

However for the case of VCSEL, increase in the width of current aperture generally reduces modulation bandwidth. It also leads to a multi-mode oscillation, which is not suitable for communication with single-mode fiber. Also for the case of edge-emitter-type laser, increase in the stripe width of active layer may undesirably result in the multi-mode oscillation.

To solve the problem, a method for reducing the resistivity by using carrier (electron-hole) inversion with tunnel junction was proposed. With the method, a most part of p-type semiconductor having high resistivity can be replaced with an n-type semiconductor.

Following current confinement structures with the tunnel junction have ever been proposed. (1) a structure based on combination of the tunnel junction and oxide confinement layer. The current confinement layer is formed over the tunnel junction by selective oxidizing of aluminum-rich layer (see Non-Patent Document 1, for example), (2) a selective tunnel junction destruction method. A part of the tunnel junction is destructed by electrode-composing metal diffusion under annealing (see Non-Patent Document 2, for example), and (3) a buried tunnel junction structure. A part of the tunnel junction is removed by etching, and then buried in a semiconductor layer or the like (see Non-Patent Document 3, for example).

Of these, the technique disclosed in Non-Patent Document 3 is excellent in controllability and reproducibility as compared with the other methods, because the current confinement width may be controlled relying upon accuracy in photolithography and etching.

The structure is also successful in suppressing strain and defect to lower levels as compared with the other methods, due to its semiconductor buried structure. Besides, optical confinement can be small, which leads to single mode oscillation with a relatively large current aperture.

[Non-Patent Document 1] Applied Physics Letters, vol. 71, p/3468 1997, J. J. Wierer et al.

[Non-Patent Document 2] IPRM'99 TuB1-4, S. Sekiguchi et al.

[Non-Patent Document 3] Laser Conf. 2000 ThC2, R. Shau et al.

[Non-Patent Document 4] Jpn. J. Appl. Phys., Vol. 39, No. 4A, pp. 1727-9 (2000), Ortsiefer et al.

[Patent Document 1] U.S. Pat. No. 6,515,308

[Patent Document 2] Japanese Laid-Open Patent Publication No. 2003-298187

DISCLOSURE OF THE INVENTION

The light emitting device with the buried tunnel junction structure has a problem in degradation of characteristics due to current leakage. The problem will be explained below, referring to FIG. 12. A light emitting device 500 exemplified herein has an n-GaAs substrate 502, and an n-electrode (−) 501 formed on the bottom surface.

On the top surface of the substrate 502, there are stacked an n-type semiconductor DBR (Distributed Bragg Reflector) 503, an n-GaAs layer 504, an active layer 505, a p-GaAs layer 506, a tunnel junction 507, an n-GaAs layer 508, an n-electrode (+) 509, and a dielectric DBR 510.

Each of the n-type semiconductor DBR 503 and the dielectric DBR 510 is as shown in the drawing, composed of a plurality of layers. The n-electrode 509 has an opening in the center, and the dielectric DBR 510 is partially formed, which close the opening.

The tunnel junction 507 is partially formed on the surface of the active layer 505, after being removed unwanted portion and is buried in the layer 508 composed of a semiconductor. The light emitting device 500 is given in a form of buried tunnel junction structure, wherein the tunnel junction 507 confines current.

In thus-configured light emitting device 500, possible leakage routes "a" to "c" are shown in FIG. 12. Route "a" is a route allowing electrons to overflow from a MQW (Multiple Quantum Well) to go through the p-cladding layer to reach the tunnel junction, and then to enter the n-type layer.

Route "b" is a route allowing electrons from the underlying n-type layer to pass through the p-type layer to reach the upper n-type layer, in the part where the tunnel junction is not formed. Route "c" is a route allowing holes generated in the tunnel junction to diffuse, and to recombine with electrons in the part not contributive to laser oscillation.

The route "c" may similarly occur also in the oxide confinement structure only to cause a limited degree of influence, whereas the routes "a" and "b" contribute largely as the leakage route. Our simulation further revealed that, in the configuration shown in FIG. 12, the route "b" most largely contributes to the leakage, as described later.

The leakage through the route "b" is specific to the tunnel junction structure having both electrodes formed on the n-type semiconductor. It is indispensable to reduce the leakage for realizing high efficiency in the light emitting device having the tunnel junction structure.

So far, in order to prevent leakage through the route "a", a structure provided with an electron blocking layer composed of Mg-doped AlGaN has proposed (see Patent Document 1, for example) This sort of electron blocking layer is often used also in the general edge-emitter-type LD (Laser Diode).

Object and effects of the electron blocking layer are all the same, except for difference resides in that the overflowed electrons in the edge-emitter-type device leak into the p-cladding layer and recombine there with the holes, whereas the electrons in the tunnel-junction-type device go through the p-cladding layer and the tunnel junction to reach the n-side.

In the configurations described in the above literatures, the leakage through the route "b" is avoided by burying the tunnel junction using a dielectric such as SiO2 in place of semiconductor. The configuration, however, has a too large optical confinement factor due to large difference in refractive index between the dielectric and the semiconductor, thereby single mode oscillation will extremely be difficult. Another typical problem relates to loss of light, because inner diameter of the electrode is smaller than diameter of the tunnel junction as a structural matter of course, and a portion of light is reflected by the electrode.

On the other hand, there has been reported a structure of a 1.55-μm-band surface emitting laser using InAlAs, higher in the energy of the conduction band edge than the active layer, as the cladding layer (see Non-Patent Document 4, for example).

Non-Patent Document 4 gives no description on object and effect of the above-described layer. It is also supposed that the layer is not intended to suppress the leakage of electrons in the p-type layer, because another InAlAs layer is provided similarly on the n-side. However, InAlAs on the p-side is supposed to function as the electron blocking layer, and may be effective to suppress leakage through the route "a" and the route "b".

However, because the layer contains aluminum, an aluminum-containing surface should be exposed when the tunnel junction is etched. The surface is highly susceptible to oxidation, and the resultant oxide film is very robust and hard to be removed by heating. The layer may, therefore, be causative of producing defects at the interface of re-growth, in the later growth process of burying.

In the configuration described in Non-Patent Document 4 described in the above, the etching is stopped in midway of the p-side of the tunnel junction. Therefore, it may not always be impossible to avoid the problem of oxidation, by forming the tunnel junction with an aluminum-free layer.

The p-side of the tunnel junction, however, needs high dopant concentration, and consequently has low resistivity. Therefore, termination of the etching in midway of the layer enhances lateral diffusion of holes, and increases the leakage through the route "c" shown in FIG. 12. In addition, an InAlAs layer provided also on the n-side in the configuration described in Non-Patent Document 4 may even interfere injection of electrons.

The present invention was conceived after considering the above described subjects. It is to provide a light emitting device having a structure capable of reducing leakage current caused by the tunnel junction structure, and of preventing oxidation of the electron blocking layer in the process of manufacturing.

According to the present invention, there is provided a first light emitting device which includes a tunnel junction having a p-type semiconductor an n-type semiconductor, and allowing electrons to pass from the p-type semiconductor to the n-type semiconductor under application of reverse bias voltage based on the tunneling effect, to thereby allow current to flow therethrough; an active layer; and an electron blocking layer positioned between the tunnel junction and the active layer, wherein the electron blocking layer has an energy of the conduction band edge higher than that of the active layer, and is composed of a material containing substantially no aluminum.

According to the present invention, there is provided also a second light emitting device which includes a tunnel junction having a p-type semiconductor an n-type semiconductor, and allowing electrons to pass from the p-type semiconductor to the n-type semiconductor under application of reverse bias voltage based on the tunneling effect, to thereby allow current to flow therethrough; an active layer; and an electron blocking layer positioned between the tunnel junction and the active layer, wherein the electron blocking layer has an energy of the conduction band edge higher than that of the active layer, and is composed of a material containing aluminum, further includes a layer containing substantially no aluminum disposed between the electron blocking layer and the tunnel junction, and area of the tunnel junction is smaller than that of the electron blocking layer.

Adoption of the above-described structures raises operations as described below. The operations of the present invention will be explained based on the above-described second light emitting device of the present invention, referring to FIG. 3 to FIG. 5. A light emitting device 600 herein is a surface emitting laser, having an n-GaAs substrate 602, and an n-electrode (−) 601 formed on the bottom surface.

On the top surface of the substrate 602, an n-type semiconductor DBR 603, an n-GaAs layer 604, an active layer 605, a p-GaAs layer 606, an electron blocking layer 607 composed of a p-$Al_{0.3}Ga_{0.7}As$ layer, a p-GaAs layer 608, a tunnel junction 609, an n-GaAs layer 610, an n-electrode (+) 611, and a dielectric DBR 612, are stacked.

Each of the n-type semiconductor DBR 603 and the dielectric DBR 612 is, as shown in the drawing, composed of a plurality of layers. The n-electrode 611 has an opening in the center, and the dielectric DBR 612 is partially formed, which closes the opening.

The tunnel junction 609 is partially formed on the surface of the electron blocking layer 607, after being removed unwanted portion, while placing a layer 608 in between, and is buried in the layer 610 composed of a semiconductor. Therefore, the light emitting device 600 is given in a form of buried tunnel junction structure, wherein the tunnel junction 609 takes part in current confinement.

In the device shown in FIG. 3, the p-$Al_{0.3}Ga_{0.7}As$ layer 607 functions as the electron blocking layer. Results of calculation of carrier flow during laser oscillation are shown in FIG. 4. FIG. 4 shows electron current density of blocking layer 607 under varied Al compositions, observed along A-A' section in FIG. 3.

Because this portion is a p-type semiconductor layer intrinsically having no electron current produced therein, the electron current therein directly means leakage current. Since the structure assumed herein has a rotation symmetry, FIG. 4 shows only a portion along the radius from the center. The radius of the tunnel junction 609 in this structure is 2.5 μm.

It is understood that the structure without the electron blocking layer 607 causes the leakage through the route "a" and the leakage through the route "b". Especially, the leakage through the route "b" is significant. In contrast, it is understood that the structure with the electron blocking layer 607, the leakage through both routes is suppressed.

It is understood from the simulation that an aluminum compositional ratio of 0.1 or larger is effective in suppressing the electron leakage. A difference in energy (ΔEc) of the conduction band edge between the electron blocking layer composed $Al_{0.1}Ga_{0.9}As$ layer and GaAs layer which functions as a barrier layer for the MQW-type active layer is approximately 80 meV. Therefore, any materials other than AlGaAs may be effective enough as the electron blocking layer 607, so far as they have ΔEc larger than the above-described value.

For example, in the case where an aluminum-free layer such as GaAsP is used as the electron blocking layer 607 as described in the above, the composition can be determined so as to adjust ΔEc to 80 meV or larger.

It was also made clear that the electron blocking layer 607 needs a enough thickness to prevent electrons from tunneling, which is specifically 10 nm or more. FIG. 5 shows measured optical output vs. current characteristics of an actually-manufactured light emitting device 600 with $Al_{0.3}Ga_{0.7}As$ layer as the above-described electron blocking layer 607, and a conventional buried-tunnel-type light emitting device without electron blocking layer shown in FIG. 12.

The both are surface emitting lasers, and have the tunnel junctions as 6-μm-diameter circular portions left by etching. The tunnel junctions adopted herein consist of InGaAs/GaAsSb described in Japanese Laid-Open Patent Publication No. 2002-134835. It may be understood from the figure that the structure with the electron blocking layer 607 is considerably improved in the efficiency.

The light emitting device of the present invention can suppress electron leakage from the n-type layer to the n-type layer through the p-type layer, by using the electron blocking layer. The electron blocking layer may consist of an aluminum-free layer. Alternatively, the electron blocking layer may consist of an aluminum-containing layer, wherein exposure of aluminum to the surface may be suppressed by placing an aluminum-free layer between the electron blocking layer and the tunnel junction, and by terminating the etching, for removing a part of the tunnel junction, inside the aluminum-free layer. With these structure, defects anticipated in the process of growth for burying may be suppressed, and thereby the desirable interface of re-growth may be formed. As a consequence, the structure may be provided in good yield.

BRIEF DESCRIPTION OF THE DRAWINGS

FIG. 8 A schematic vertically-sectioned front elevation showing a stacked layer structure of a light emitting device according to a third embodiment of the present invention.

BEST MODES FOR CARRYING OUT THE INVENTION

Figure 1:
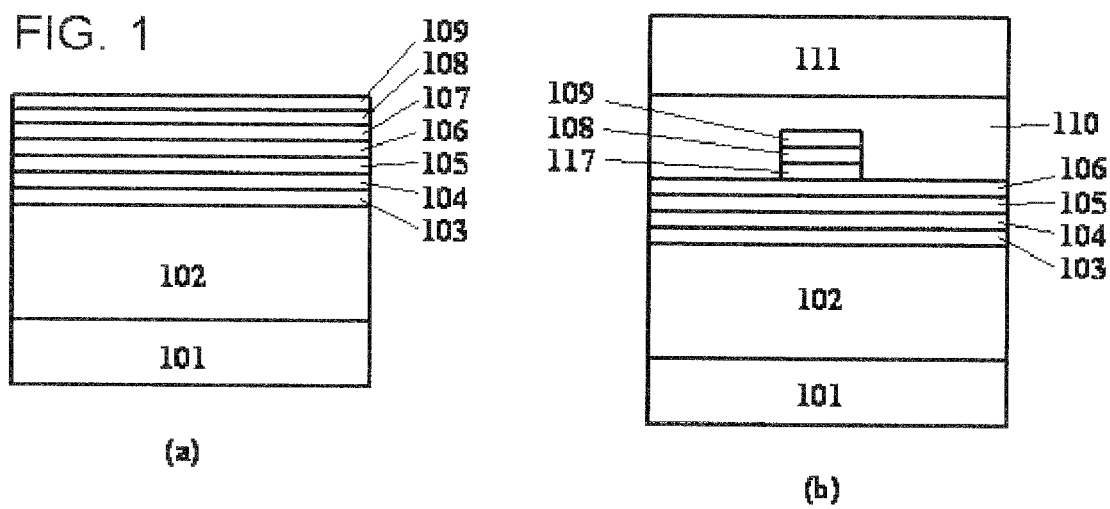
FIG. 1 A schematic vertically-sectioned front elevation showing a stacked layer structure of a light emitting device according to a first embodiment of the present invention.
Figure 2:
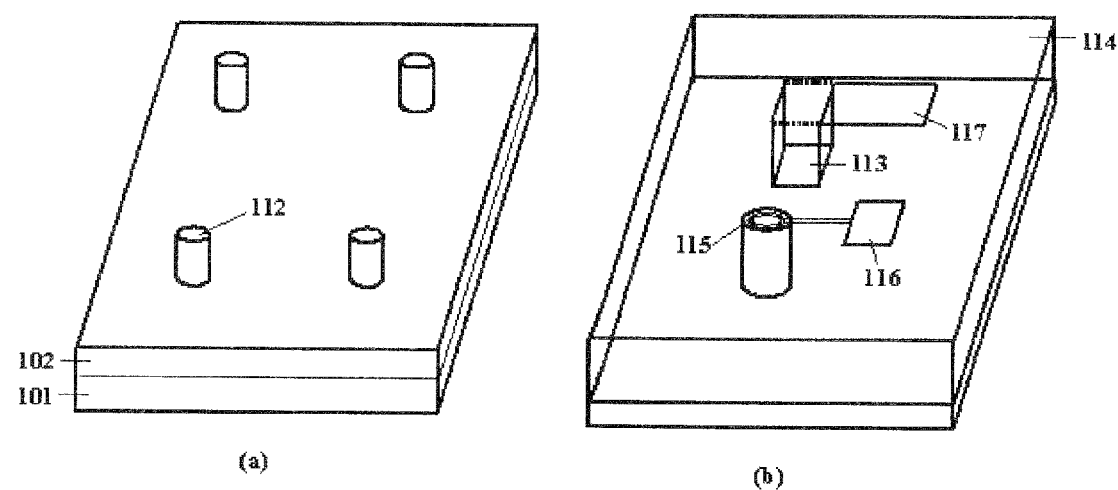
FIG. 2 A schematic perspective view of a light emitting device in the process of manufacturing.
Figure 3:
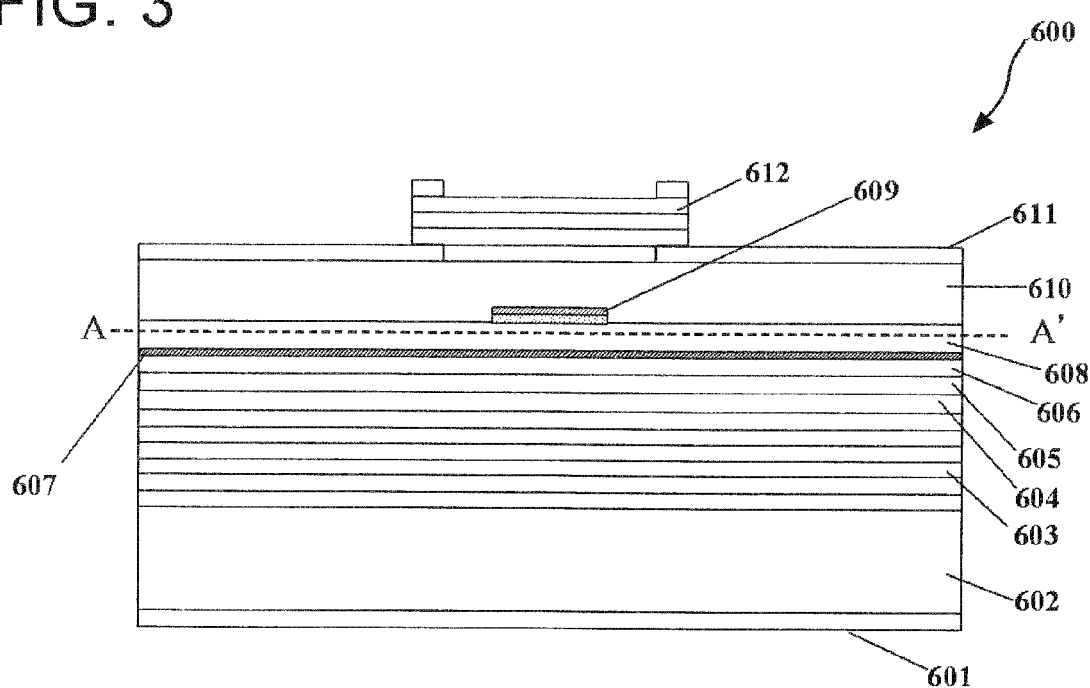
FIG. 3 A schematic vertically-sectioned front elevation showing a stacked structure of a light emitting device according to a referential example of the present invention.
Figure 4:
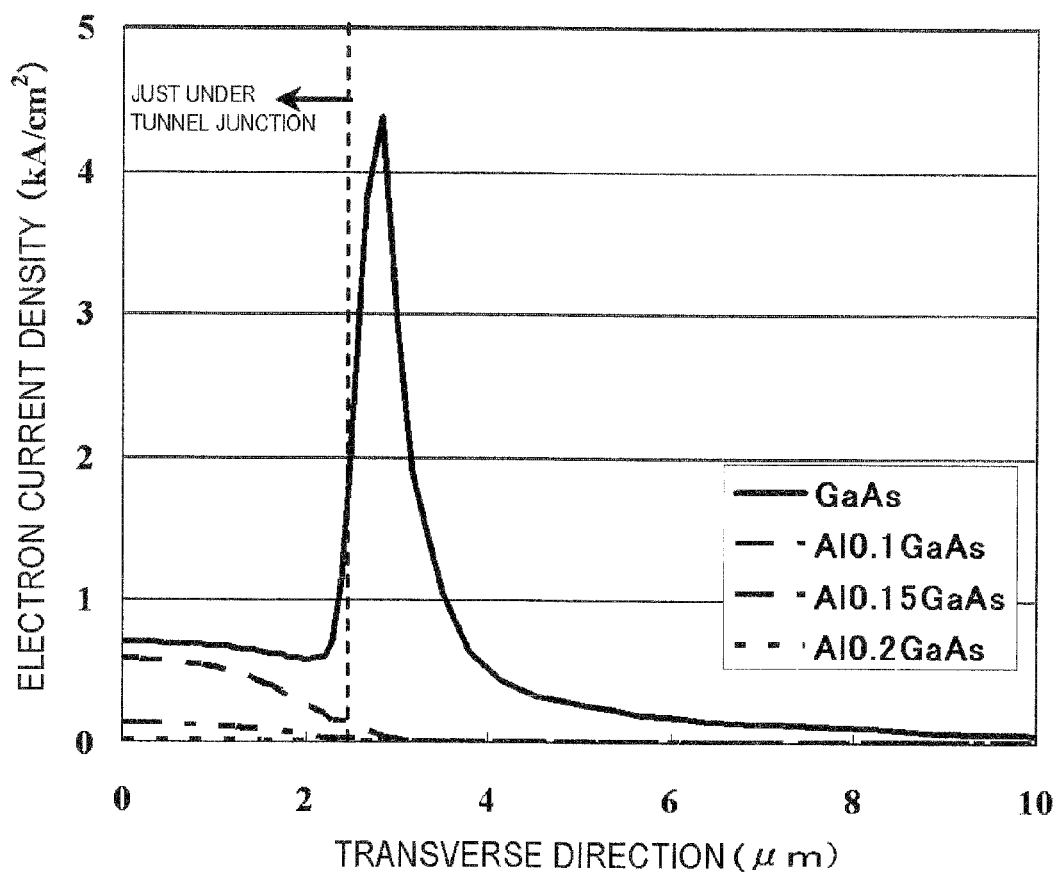
FIG. 4 A characteristic curve showing current density of the electron in the blocking layer.
Figure 5:
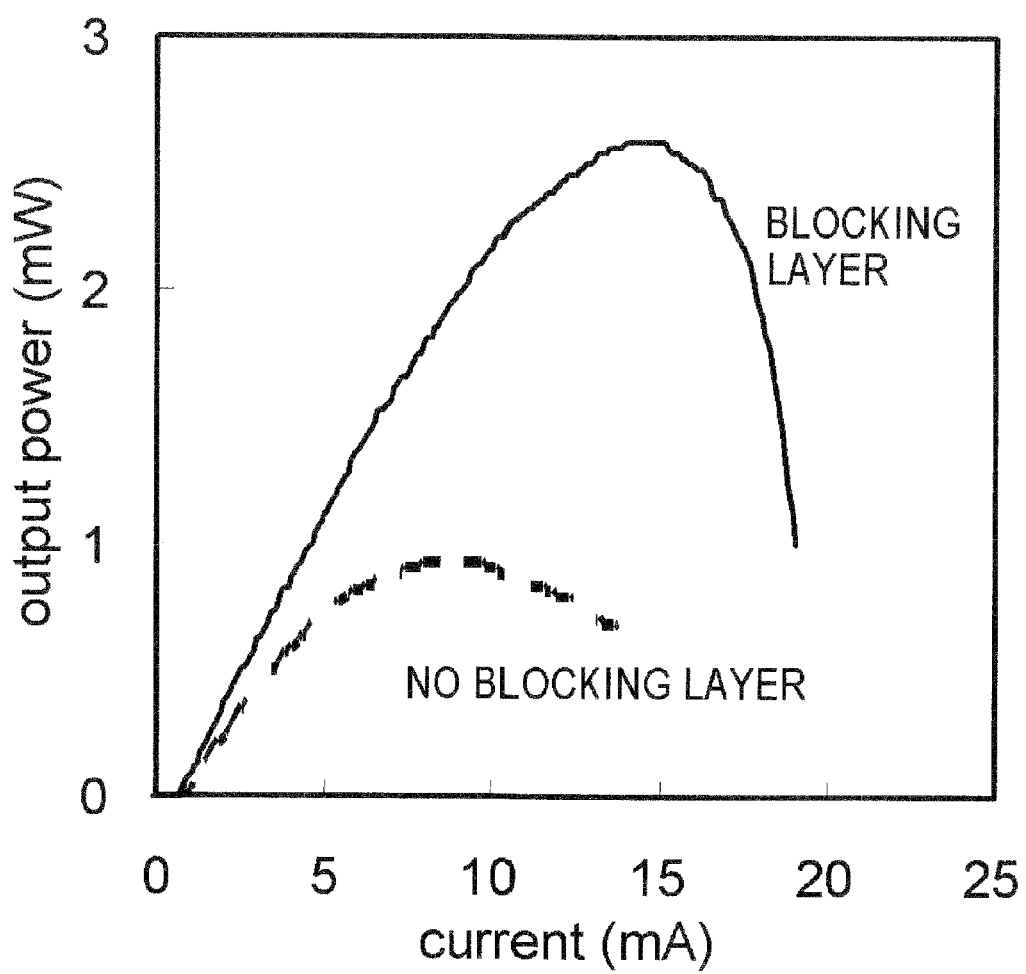
FIG. 5 A characteristic curve showing leakage current of the structure with and without the electron blocking layer.

Next, embodiments of the present invention will be explained referring to the attached drawings. First, a light emitting device according to a first embodiment of the present invention will be explained referring to FIG. 1 and FIG. 2. An example shown herein is a surface emitting laser applied with the present invention, formed on a GaAs substrate and having an oscillation wavelength of 1.3 μm.

First, as shown in FIG. 1(a), on an n-type GaAs substrate 101, first DBR layer 102 are grown. The first DBR layer 102 consists of a plurality of DBRs (n-type semiconductor mirror layers) each of which composed of a pair of an n-type GaAs layer and an n-type $Al_{0.9}Ga_{0.1}As$ layer as a basic unit, are grown. Then, an n-type GaAs cladding layer 103, an active layer 104 composed of non-doped GaInNAs quantum wells and a GaAs barrier layer, a p-type GaAs cladding layer 105, a p-$GaAs_{0.25}P_{0.75}$ layer 106 composing the electron blocking layer; a $p^+$-$In_{0.1}Ga_{0.9}As$ layer 107, an $n^+$-$Ga_{0.9}In_{0.1}N_{0.02}As_{0.098}$ layer 108, and an n-GaAs layer 109 are sequentially grown by metal organic chemical vapor deposition (MOCVD) process (first step).

A p-type dopant of the layer 107 used herein was C, an n-type dopant of the layer 108 used herein was Se, wherein p-doping concentration was adjusted to $8 \sim 10^{19}$ cm$^{-3}$, and n-doping concentration was adjusted to $5 \sim 10^{19}$ cm$^{-3}$. Thickness of each layer was adjusted to 5 nm for the layer 107, and 10 nm for the layer 108. Thickness of the layer 106 is 20 nm, and thickness of the other layers is determined so that optical path length from the layer 103 to the layer 107 may be approximately 5/4 of the oscillation wavelength.

Next, circular resist masks each having a diameter of approximately 6 μm are formed by a photolithographic technique, and the layer 107 to the layer 109 are removed by etching. The photoresists are then removed (second step).

Next, again using the MOCVD process, an n-GaAs layer 110, and a second DBR layer 111 are grown. The second DBR layer 111 consists of, a plurality of DBRs (n-type semiconductor mirror layers) each of which composed of a pair of an n-type $Al_{0.9}Ga_{0.1}As$ layer and an n-type GaAs layer as a basic unit. (third step).

In each of the DBR layers, thickness of each of high-refractive-index GaAs layers and low-refractive-index $Al_{0.9}Ga_{0.1}As$ layers is adjusted so that each of these media will have the optical path length of as long as approximately ¼ of the oscillation wavelength. In the light emitting device of this embodiment, the DBR layers 102, 111 function as reflecting mirrors, and the layers from the layer 103 to the layer 110 functions as a resonator.

Next, a dielectric film is deposited on the second DBR layer 111, a resist is coated thereon, and circular resist masks are formed by a photolithographic technique so as to make the center of the resist coincide with the axial centers of the 6-μm-diameter buried tunnel junction formed in the second step.

After the dielectric film is etched by dry etching, the resist is removed to thereby form circular dielectric masks. Next, dry etching is proceeded until the surface of the first DBR layer 102 exposes as shown in FIG. 2(a), to thereby form cylindrical structural bodies 112 having a diameter of approximately 20 μm (fourth step). The dielectric masks are then removed.

Next, on the first DBR exposed by the above-described mesa etching, an electrode is formed. First, a photoresist is coated over the entire surface, and then removed by lithography only in the portion where the electrode will be formed later. After AuGe/AuNi is deposited by vacuum evaporation, the photoresist is removed by the lift-off process, so as to form the electrode 113 on the portion of the first DBR (fifth step).

Next, the mesas are buried by a polyimide 114 as shown in FIG. 2(b), and the polyimide 114 is then removed by lithography in the portion over the electrode 113 formed in the fifth step (sixth step).

Next, electrodes are formed. First, a photoresist is coated, patterned by light exposure through a mask. Then AuGe/AuNi is deposited by vacuum evaporation, and the photoresist is removed by the lift-off process, so as to form an electrode 115 and a pad electrode 116 connected, as shown in FIG. 2(b).

At the same time, a pad electrode 117 is formed on the polyimide, as being connected with the electrode 113 formed on the first DBR in the above-described fifth step (seventh step). The VCSELs thus manufactured on the GaAs substrate may be available as being diced one by one, or diced to produce a desired array (1~10 devices, 100~100 devices, for example).

In the VCSEL obtained by the steps of manufacturing described in the above, the $p^+$-$In_{0.1}Ga_{0.9}As$ layer 107 and the $n^+$-$Ga_{0.9}In_{0.1}N_{0.02}As_{0.098}$ layer 108 configure the tunnel junction. The layers 107, 108 composing the tunnel junction are removed in the second step except the circular portions with a diameter of approximately 6 μm, and the portions where the tunnel junction was removed has only an extremely small tunneling probability. Therefore, the tunnel current flow only in the circular portions.

Moreover, since refractive indices of these layers are larger than that of the GaAs layer, the circular portions have also a light guiding effect. The layers 107, 108 are highly doped to increase tunneling probability.

These layers, therefore, have larger light absorption coefficients than those of the other layers. The light absorption is suppressed by placing these layers around the nodes of a standing wave which generates during VCSEL oscillation.

The layer 106 exposes to the surface as a result of etching of the layers 107, 108 excluding portions in the second step. However only very thin oxide layer is formed because the $GaAs_{0.25}P_{0.75}$ layer 106 contains no aluminum, and it may readily be removed in the process of temperature elevation before the re-growth in the third step.

Energy of the conduction band edge of the $GaAs_{0.25}P_{0.75}$ layer 106 in this configuration is higher by approximately 120 meV than that of the GaAs layer which composes a barrier layer of the active layer 104, so leakage of electrons from the layer 103 to the layer 110 can be sufficiently suppressed. As a consequence, current flows through the layers 107, 108 approximately 6 μm in diameter, and efficiently contributes to laser oscillation, so excellent characteristics including low threshold current and high efficiency can be realized.

Figure 6:
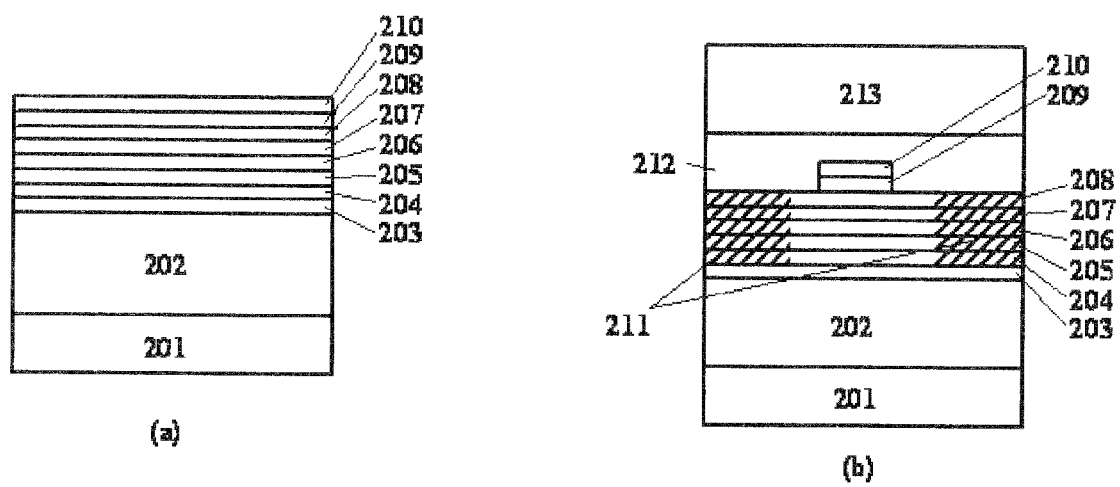
FIG. 6 A schematic vertically-sectioned front elevation showing a stacked structure of a light emitting device according to a second embodiment of the present invention.
Figure 7:
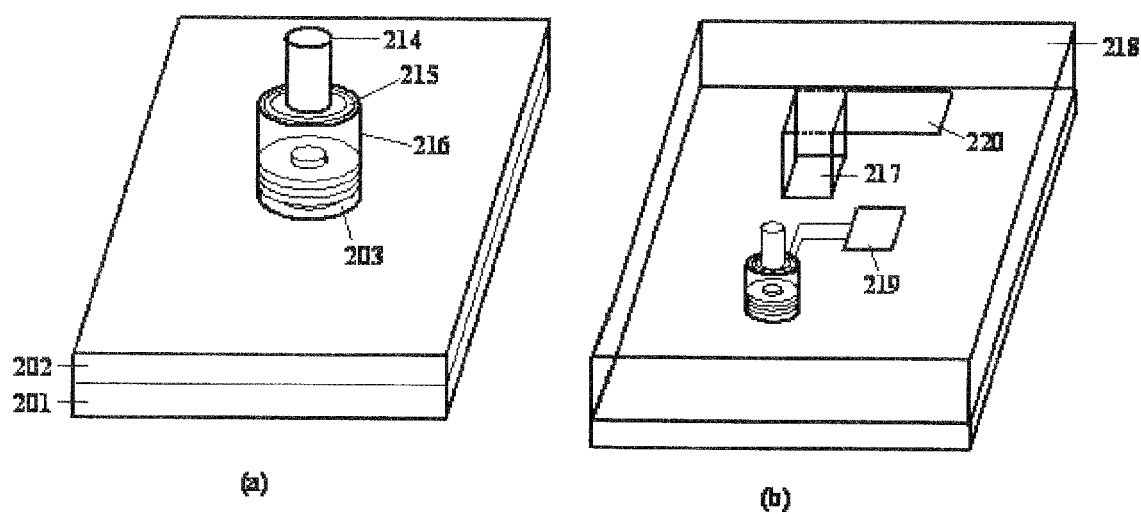
FIG. 7 A schematic perspective view of a light emitting device in the process of manufacturing.

Next, a configuration of the light emitting device according to a second embodiment of the present invention will be explained, referring to FIG. 6 and FIG. 7. An example explained herein is such as applying the present invention to a surface emitting laser having an oscillation wavelength of 1.15 μm, formed on a GaAs substrate.

First, as shown in FIG. 6(a), on an n-type GaAs substrate 201, first DBR layer 202 are grown. The first DBR layer 202 consists of a plurality of DBRs (n-type semiconductor mirror layers) each of which composed of a pair of an n-type GaAs layer and an n-type $Al_{0.9}Ga_{0.1}As$ layer as a basic unit. Then a layer for oxidization 203 composed of n-type $Al_xGa_{1-x}As$ (where, $0.9 < x < 1$), an n-type GaAs cladding layer 204, an active layer 205 composed of non-doped $In_{0.35}Ga_{0.65}As$ quantum wells and a GaAs barrier layer, a p-GaAs cladding layer 206, a p-$Al_{0.3}Ga_{0.7}As$ layer 207, a p-GaAs layer 208, a $p^+$-$GaAs_{0.9}Sb_{0.1}$ layer 209; and an $n^+$-$In_{0.15}Ga_{0.85}As$ layer 210 are sequentially grown by metalorganic chemical vapor deposition (MOCVD) process (first step).

A p-type dopant of the layer 209 used herein was C, an n-type dopant of the layer 210 used herein was Si, wherein p-doping concentration was adjusted to $1~10^{20}$ cm$^{-3}$, and n-doping concentration was adjusted to $2~10^{19}$ cm$^{-3}$. Thickness of the individual layers was adjusted to 5 nm for the layer 209, and 10 nm for the layer 210. Thickness of each of the layers 207, 208 is 40 nm and 20 nm, respectively, and thickness of each of any other layers is determined so that optical path length from the layer 204 to the layer 209 may be approximately 5/4 of the oscillation wavelength.

Next, a circular resist mask having a diameter of approximately 8 μm is formed by a photolithographic technique, and O ion is implanted (second step). As a consequence, the resistivity of portions (211), where the rest was removed, increased.

The resist is then removed, and a 4-μm-diameter circular resist mask is newly formed. The resist mask is formed so as to make its center coincide with the center of the 8-μm-diameter region remained unimplanted with ion in the second step.

Next, the layers 209, 210 are removed by etching, and the photoresist is then removed (third step). In this process, the etching time is adjusted so as to terminate the etching inside the layer 208.

Next, again by using the MOCVD process, an n-GaAs layer 212, and a second DBR layer 213 are sequentially grown. The second DBR layer 213 consists of a plurality of DBRs (non-doped semiconductor mirror layers) each of which composed of a pair of a non-doped GaAs layer and an $Al_{0.9}Ga_{0.1}As$ layer (fourth step). In each DBR layer, the thickness of each of the high-refractive-index GaAs layer and the low-refractive-index $Al_{0.9}Ga_{0.1}As$ layer is determined so that each of these media will have the optical path length of as long as approximately 1/4 of the oscillation wavelength.

Next, a circular dielectric mask having a diameter of 10 μm is formed so as to make the axial center coincide with that of the circular buried tunnel junction formed in the third step, and the second DBR layer 213 is then processed by dry etching until the surface of the n-GaAs layer 212 exposes (fifth step).

In this way, a cylindrical structural body 214 having a diameter of 10 μm is formed. Next a ring electrode 215 composed of AuGeNi is formed on the portion of the n-GaAs layer 212 exposed around the cylindrical structural body 214 (sixth step).

Next, a circular dielectric mask having a diameter of 30 μm is formed so as to make the axial center coincide with that of the cylindrical structural body 214 formed in the fifth step, and a cylindrical structural body 216 having a diameter of approximately 30 μm is formed by dry etching so as to reach a certain depth in the first DBR layer 202 as shown in FIG. 7(a) (seventh step).

By this step, the side surface of the layer for oxidization 203 are exposed. Then, the photoresist is removed. Next, oxidization process is carried out in a furnace with a steam atmosphere at a temperature of approximately 420° C. for approximately 10 minutes (eighth step).

By this process, only the layer for oxidization 203 is simultaneously oxidized selectively in an annular region. Conditions for the oxidationis adjusted so that the center portion, having a diameter of approximately 5 μm, of the layer for oxidization 203 remains unoxidized. The reason why "x" herein was adjusted to a value larger than 0.9 is that the value of 0.9 or smaller may hardly proceed the oxidation, and that the oxidation speed may necessarily be set faster than that for the DBR portion.

Next, an electrode is formed on the first DBR layer 202 exposed in the seventh step. First, a photoresist is coated over the entire surface, and then removed by a lithographic technique only in a portion where the electrode will be formed later. AuGe/AuNi is then deposited by vacuum evaporation, and the photoresist is removed by the lift-off process, so as to form an electrode 217 partially on the first DBR layer 202 (ninth step).

Next, the mesa is buried by a polyimide 218 as shown in FIG. 7(b), and the polyimide 218 is then removed by lithography in the portions over the cylindrical structural body 216 formed in the seventh step and over the electrode 217 formed in the eighth step (tenth step).

Next, pad electrodes 219, 220 are formed on the polyimide 218. These pad electrodes are respectively connected to the ring electrode 215 formed in the sixth step, and electrode 217 on the first DBR, formed in the eighth step (eleventh step). The VCSELs thus manufactured on the GaAs substrate may be available as being diced one by one, or diced to produce a desired array (1~10 devices, 100~100 devices, for example).

In this embodiment, the $p^+$-$GaAs_{0.9}Sb_{0.1}$ layer 209 and the $n^+$-$In_{0.15}Ga_{0.85}As$ layer 210 configure the tunnel junction. The layers 209, 210 composing the tunnel junction are removed in the third step except circular portions with a diameter of approximately 4 μm. The portions where the tunnel junction was removed have only an extremely small tunneling probability. Therefore, the tunnel current flows only in the circular portions.

Moreover, since these layers have refractive indices larger than that of the GaAs layer, the circular portion has also a light guiding effect. The layers 209, 210 are highly doped to increase tunneling probability.

These layers, therefore, have larger light absorption coefficients than those of the other layers. The light absorption is suppressed by placing these layers around the nodes of a standing wave which generates during VCSEL oscillation.

The layers 209, 210 are etched excluding a part in the third step as described in the above, wherein the etching time is controlled so as to terminate the etching inside the layer 208. Because this layer contains no aluminum, the surface oxide film is extremely thin, and may readily be removed in the process of temperature elevation before the re-growth in the third step.

Energy of the conduction band edge of the p-$Al_{0.3}Ga_{0.7}As$ layer 207 in this configuration is higher by approximately 240 meV than that of the GaAs layer provided as a barrier layer of the active layer 205. Thus, the leakage of electrons from the layer 204 to the layer 212 can be sufficiently suppressed. As a consequence, current flows through the layers 209, 210 approximately 4 μm in diameter, and effectively contributes to laser oscillation so as to realize excellent characteristics including low threshold current and high efficiency.

By the way, elevation in resistivity of the surrounding part of the active layer by ion implantation of H, O and so forth in the second step, and lateral oxidation of the AlGaAs layer in the eighth step are often adopted for the purpose of current confinement. However, the current confinement in this embodiment is realized by tunnel junction similarly to as in the first embodiment and the ion implantation and the oxide layer does not play a role of current confinement.

The ion implantation is adopted for the purpose of reducing electric capacitance of the surrounding part of the tunnel junction in the cylindrical structural body 216. By this configuration, the upper limit of modulation band, determined by resistivity and capacitance of the device, may be raised, thereby ultra-high-speed modulation is possible with this structure. The oxide layer is adopted for the purpose of controlling optical confinement in the lateral direction, wherein the optical confinement can be adjustable by controlling the aperture of the oxide layer.

Figure 9:
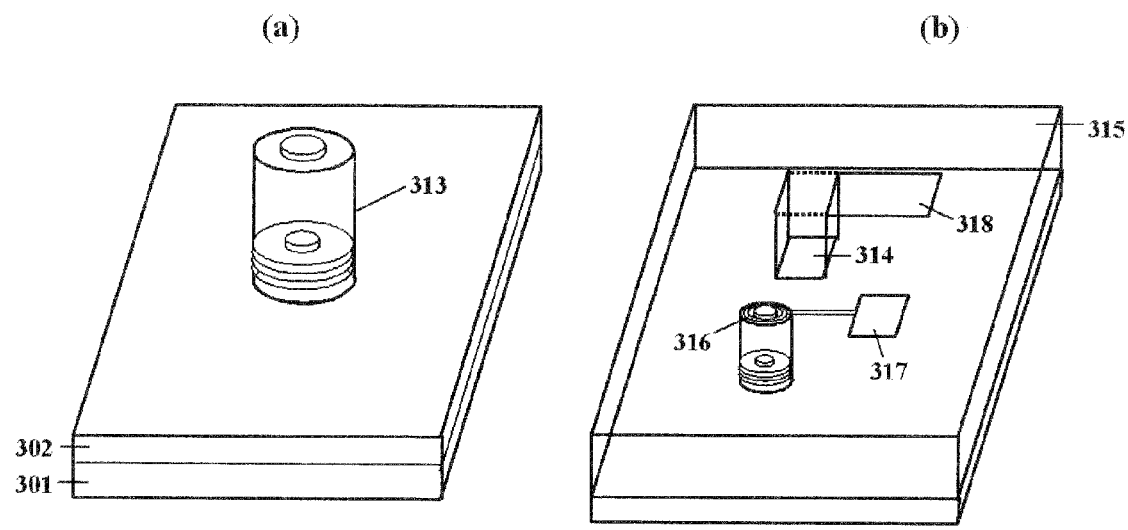
FIG. 9 A schematic perspective view of a light emitting device in the process of manufacturing.

Next, a configuration of the light emitting device according to a third embodiment of the present invention will be explained, referring to FIG. 8 and FIG. 9. An example explained herein is such as applying the present invention to a surface emitting laser having an oscillation wavelength of 1.3 μm, formed on an InP substrate.

First, as shown in FIG. 8(a), on the n-type InP substrate 301, a first DBR layer 302 are grown. The first DBR layer 302 consists of a plurality of DBRs (n-type semiconductor mirror layers) each of which composed of a pair of an n-type InP layer and an n-type AlGaInAs layer matched in lattice with InP as a basic unit. Then, an active layer 304 composed of a non-doped $Al_{0.15}Ga_{0.15}In_{0.7}As$ quantum wells and an $Al_{0.34}Ga_{0.22}In_{0.44}As$ barrier layer, a p-type InP-cladding layer 305, a p-$In_{0.52}Al_{0.48}AS$ layer 306, a p-InP layer 307, a $p^+$-$Al_{0.27}Ga_{0.20}In_{0.53}As$ layer 308, an $n^+$-$In_{0.76}Ga_{0.24}As_{0.51}P_{0.49}$ layer 309, and an n-InP layer 310 are sequentially grown by the metal organic chemical vapordeposition (MOCVD) process (first step).

A p-type dopant of the layer 308 used herein was C, an n-type dopant of the layer 309 used herein was Si, wherein doping concentration was adjusted to $7\sim10^{19}$ cm$^{-3}$ for the layer 308, and to $1.5\sim10^{19}$ cm$^{-3}$ for the layer 309. Thickness of each layer was adjusted to 5 nm for the layer 308, and 15 nm for the layer 309. Thickness of the layer 306 is 30 nm, wherein thickness of each of any other layers is determined so that optical path length from the layer 303 to the layer 308 may be approximately 5/4 of the oscillation wavelength.

Next, a circular resist mask having a diameter of approximately 6 μm is formed by a photolithographic technique, and the layer 308 to the layer 310 are removed. The photoresist is removed thereafter (second step). The etching time is controlled so as to terminate the etching inside the layer 307.

Next, an n-type InP layer 311 is stacked again by the MOCVD process (third step). Thickness of the layer 311 is adjusted so that the optical path length may be is 5/4 of the oscillation wavelength. Then, a second DBR layer 312 is formed on the wafer by sputtering. It consists of a plurality of DBRs (n-type semiconductor mirror layers) each of which composed of a pair of $SiO_2$ and amorphous Si (a-Si) as a basic unit.

Thickness of each of the $SiO_2$ layer and the a-Si layer is determined so that each of these media will have the optical path length of as long as approximately ¼ of the oscillation wavelength. Next, by photolithography and etching, the second DBR layer 312 is removed while leaving a circular portion of approximately 10 μm in diameter coaxially on the circular tunnel junction formed in the second step.

Next, as shown in FIG. 9(a), a cylindrical structural body 313 having a diameter of approximately 30 μm, reaching the surface of the first DBR layer 302, is formed by the procedures similar to those described in the first embodiment (fourth step). Next, an electrode is formed on the first DBR exposed by the above-described mesa etching.

First, a photoresist is coated on the entire surface, and then removed by lithography only in the portion where the electrode will be formed later. AuGe/AuNi is then deposited by vacuum evaporation, and the photoresist is removed by the lift-off process, so as to form an electrode 314 partially on the first DBR layer (fifth step).

Next, as shown in FIG. 9(b), the mesa is buried by a polyimide 315, and the polyimide 315 on the electrode is then removed by lithography (sixth step). Next, electrodes are formed.

First, a photoresist is coated (not shown), patterned by light exposure through a mask, AuGe/AuNi is deposited by vacuum evaporation, and the photoresist is removed by the lift-off process, so as to form a ring electrode 316 and a pad electrode 317 connected, as shown in FIG. 9(b).

In this process, also an electrode pad 318 is formed at the same time on the polyimide 315, as being connected with the electrode 314 on the first DBR formed in the fifth step (seventh step). The VCSELs thus manufactured on the InP substrate may be available as being diced one by one, or diced to produce a desired array (1~10 devices, 100~100 devices, for example).

In the VCSEL obtained by the above-described method of manufacturing, the $p^+$-$Al_{0.27}Ga_{0.20}In_{0.53}As$ layer 308 and the $n^+$-$In_{0.76}Ga_{0.24}As_{0.51}P_{0.49}$ layer 309 configure the tunnel junction. These layers are removed in the second step except the circular portions having a diameter of approximately 6 μm, and such circular portions exhibit current confinement effect and light guiding effect.

Similarly to as in the first and second embodiments, the light absorption is suppressed, by placing the tunnel junction around the nodes of a standing wave which generates during VCSEL oscillation. The layers 308, 309 are etched excluding a part in the second step as described in the above, wherein the etching time is controlled so as to terminate the etching inside the layer 307.

Because this layer contains no aluminum, the surface oxide film is extremely thin, and may readily be removed in the process of temperature elevation before the re-growth in the third step. It should be noted that, in this embodiment, the $p^+$-$Al_{0.27}Ga_{0.20}In_{0.53}As$ layer 308 contains aluminum, and the side surface of it are exposed and then oxidized in the process of the etching in the second step. However, the layer are extremely thin as 5 nm, and, oxidized are is very small as compared with the case where the bottom surface of etching is exposed. Thus the influence is also very small.

Also in this configuration, similarly to as in the first and second embodiments, the p-$In_{0.52}Al_{0.48}As$ layer 306 functions as an electron blocking layer, and leakage of electrons from the layer 303 to the layer 311 may sufficiently be suppressed. As a consequence, current flows through the layers 308, 309 having a diameter of approximately 6 μm, and effectively contributes to laser oscillation so as to realize excellent characteristics including low threshold current and high efficiency.

Figure 10:
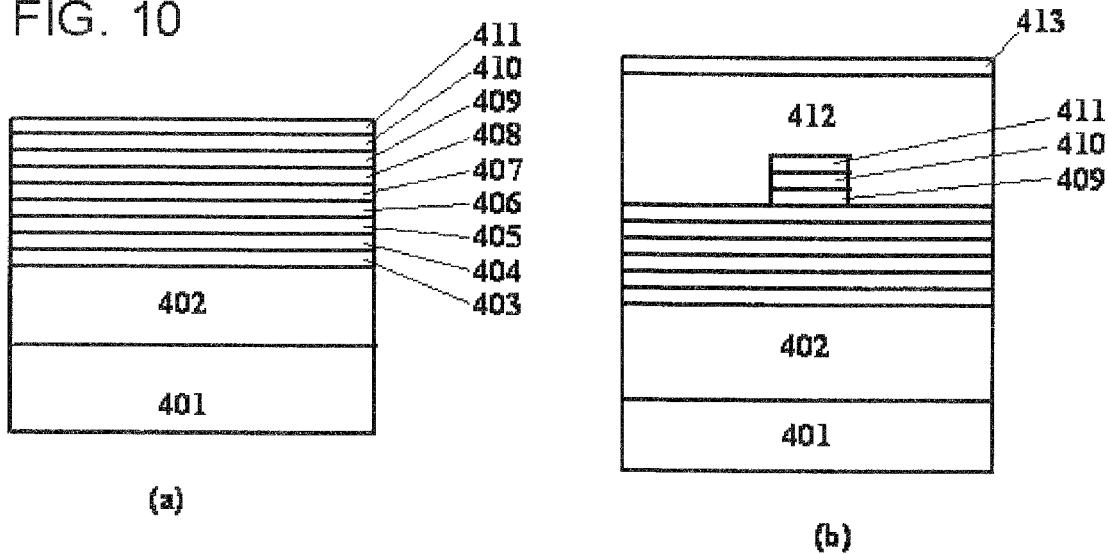
FIG. 10 A schematic vertically-sectioned front elevation showing a stacked layer structure of a light emitting device according to a third embodiment of the present invention.

Next, a configuration of the light emitting device according to a fourth embodiment of the present invention will be explained, referring to FIG. 10 and FIG. 11. An example explained herein is such as applying the present invention to an edge emitting laser having an oscillation wavelength of 1.3 μm, formed on an InP substrate.

First, on an n-InP substrate 401, an n-InP first cladding layer 402; an $In_{0.8}Ga_{0.2}As_{0.43}P_{0.57}$-SCH layer 403; an active layer 404 composed of non-doped $In_{0.8}Ga_{0.2}As_{0.64}P_{0.36}$ quantum wells and an $In_{0.8}Ga_{0.2}As_{0.43}P_{0.57}$ barrier layer; an $In_{0.8}Ga_{0.2}As_{0.43}P_{0.57}$-SCH layer 405; a p-InP cladding layer 406; a p-$In_{0.2}Ga_{0.8}P$ layer 407; a p-InP layer 408; a $p^+$-$GaAs_{0.8}Sb_{0.2}$ layer 409; an $n^+$-$In_{0.76}Ga_{0.24}As_{0.51}P_{0.49}$ layer 410, and an n-InP layer 411 are sequentially grown by the metal organic chemical vapor deposition (MOCVD) process (first step).

A p-type dopant of the layer 409 used herein was C, an n-type dopant of the layer 410 used herein was S, wherein doping concentration was adjusted to $1.5~10^{20}$ cm$^{-3}$ for the layer 409, and to $5~10^{19}$ cm$^{-3}$ for the layer 410. As for thickness of the individual layers, the layer 409 was adjusted to 4 nm, and the layer 410 was adjusted to 10 nm. Thickness of the layer 407 was 10 nm.

Next, a $SiO_2$ film is formed on this wafer by thermal CVD, a stripe-patterned mask of 2 μm wide is formed thereon by a photolithographic technique, and the layer 409 to the layer 411 are removed by etching (second step).

Thereafter, again by the MOCVD process, an n-InP second cladding layer 412 and an n-InGaAs contact layer 413 are grown by the MOCVD process (third step).

Figure 11:
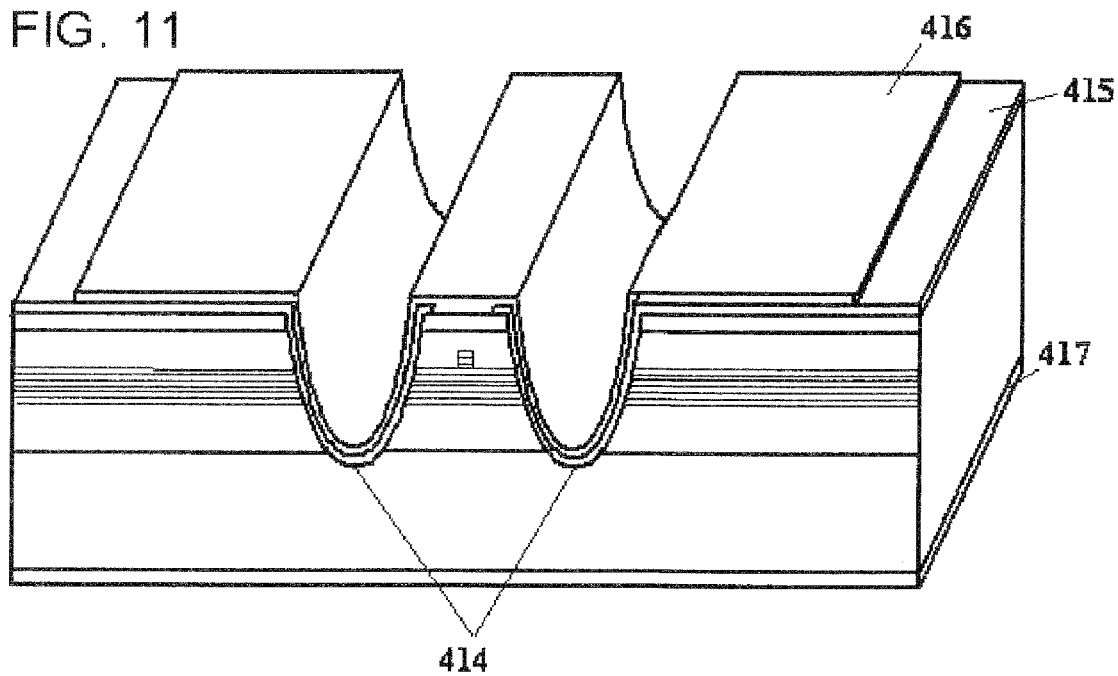
FIG. 11 A schematic perspective view showing a light emitting device.
Figure 12:
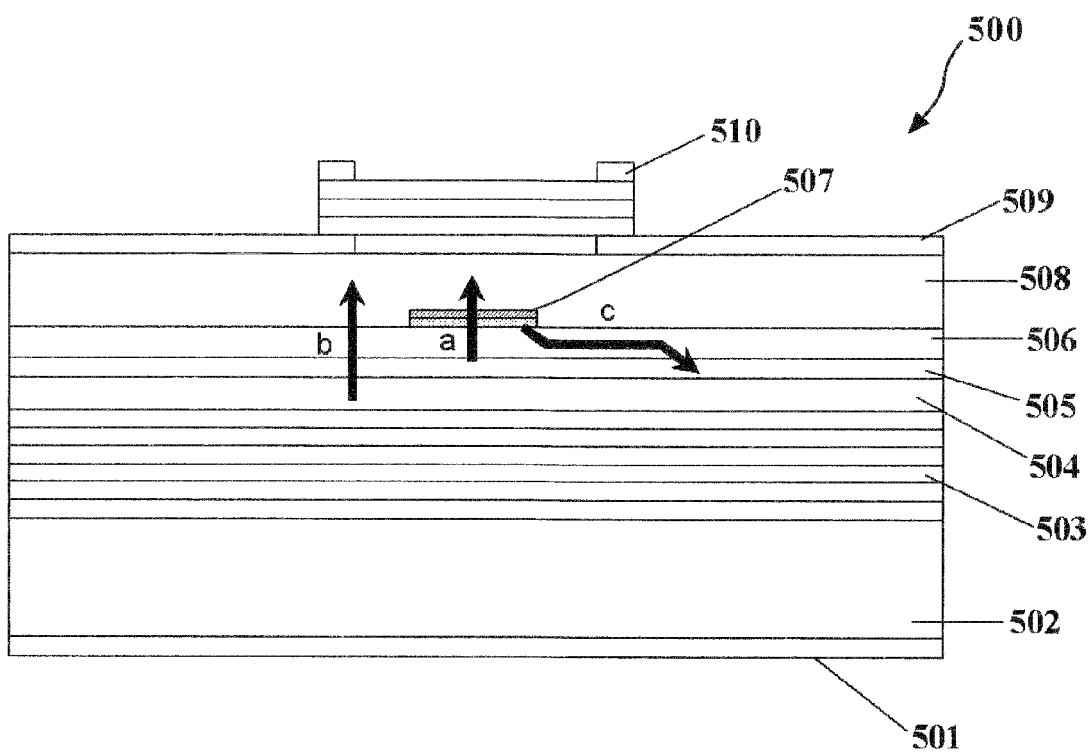
FIG. 12 A schematic vertically-sectioned front elevation showing a stacked layer structure of a conventional light emitting device.

As shown in FIG. 11, on the epitaxial wafer, two trenches 414 with a depth of 4 to 5 μm and 15 μm pitch are formed while placing the active layer centered therebetween, for the purpose of electrical isolation (fourth step).

A $SiO_2$ film 415 of 0.4 μm thick is formed thereon by thermal CVD, and an opening of 20 μm wide is formed in the $SiO_2$ film over the active layer by photolithography and etching. Next, AuGeNi alloy, Ti (50 nm) and Au (400 nm) are deposited by vacuum evaporation, the metal films are then removed by photolithography and ion milling in the region where the devices are physically isolated later. With these processes, a surface electrode 416 is formed. (fifth step)

Next, the wafer is lapped from the n-InP substrate side until the wafer is thinned to 100 μm in order to facilitate cleavage, and AuGeNi alloy, Ti (50 nm) and Au (400 nm) are deposited on the back surface, to thereby form a back electrode 417. The processed wafer is cleaved, then formed a low-reflecting coating on one surface and a high-reflecting coating on the other surface, and diced one by one to complete the laser (sixth step).

In the edge emitting laser obtained by the above-described fabrication process, the $p^+$-$GaAs_{0.8}Sb_{0.2}$ layer 409 and the $n^+$-$In_{0.76}Ga_{0.24}As_{0.51}P_{0.49}$ layer 410 form the tunnel junction, and the p-$In_{0.2}Ga_{0.8}P$ layer 407 functions as the electron blocking layer.

The layer 409 to the layer 411 are removed in the third step except the stripe portions of 2 μm, but no problem of oxidation occurred since all the layers used in this embodiment contain no aluminum and therefore.

Comparing now the laser structure of this embodiment with a conventional laser structure configuring the entire portion above the active layer using p-type semiconductors, the configuration of this embodiment can replace most part of the p-cladding layer above the active layer with n-cladding layers which are lower in resistivity than the p-type semiconductors. Thus the resistivity as a whole can be reduced even taking resistivity ascribable to the tunnel junction into consideration.

In addition, the portions other than the tunnel junction have extremely small probability of tunneling, and hardly allow current to flow. Leakage current may therefore be suppressed as compared with the conventional structure. Although the tunnel junction shows large absorption of light due to its large doping concentration, absorption of light by the cladding layers may be lowered than in the conventional structure because n-type semiconductor shows smaller absorption of light than p-type semiconductor.

Although only four embodiments of the present invention have been described, modes of embodiment of the present invention are by no means limited to the above-described embodiments, and can be modified in various ways without departing from the scope of the invention.

For example, the above-described embodiments exemplified the cases where a portion of the tunnel junction is removed so as to form the current confinement structure. Alternatively, it may also be allowable to form a dielectric mask after the lower DBR and the active layer were grown, selectively form the tunnel junction based on selective growth, remove the mask, and grow a burying layer (not shown). Also by this method, the current confinement at the tunnel junction can be realized, similarly to the case where etching was adopted.

Although the light emitting device of the above-described embodiments has been exemplified as laser, the present invention may similarly be adoptable also to light emitting diode (LED), further allowing selection of any other wavelength and materials of the light emitting devices other than those exemplified in the embodiments.

The above-described first and fourth embodiments described the case where the layers containing no aluminum were used as the electron blocking layer. However, completely aluminum-free is not necessarily indispensable, instead allowing the layers to contain substantially no aluminum.

In other words, aluminum may be contained so far as the problem of surface oxidation will be negligible, and may be contained up to a range where the aluminum content may be assumed as a dopant level, more specifically, up to an aluminum ratio of 1% or smaller relative to the Group-III elements. The aluminum content can be verified by analysis such as SIMS (secondary ion mass spectroscopy).

Another allowable structure may be such that the electron blocking layer has energy of the valence band edge lower than those of both adjacent layers, and the composition is gradate between the electron blocking layer and each of both adjacent layer (not shown).

As has been described in the above, the electron blocking layers adopted herein were GaAsP, AlGaAs and so forth, which have high energy of the conduction band edge. These layers also have lower energy of the valence band edge (higher in terms of hole energy) than that of GaAs generally used on both sides of the layers.

For this reason, blocking effect may arise also against the holes, which can cause resistivity increase. This may be suppressed by graded change of the above-described causal composition, and thereby increase in the resistivity can be avoidable. It is to be noted that the blocking effect against electrons will never degrade even in such configuration, if ΔEc is ensured to a sufficient level.

The invention claimed is:

1. A light emitting device comprising:
   a tunnel junction having a p-type semiconductor an n-type semiconductor, and allowing electrons to pass from said p-type semiconductor to said n-type semiconductor under application of reverse bias voltage based on the tunneling effect, to thereby allow current to flow therethrough;
   an active layer; and
   an electron blocking layer positioned between said tunnel junction and said active layer,
   wherein said electron blocking layer has an energy of the conduction band edge higher than that of said active layer, and is composed of a material containing aluminum,
   further comprising a layer containing substantially no aluminum, disposed between said electron blocking layer and said tunnel junction, and
   area of said tunnel junction is smaller than that of said electron blocking layer.

2. The light emitting device as claimed in claim 1, further comprising:
   a GaAs substrate on which at least said active layer and said electron blocking layer and said tunnel junction are stacked,
   wherein said electron blocking layer is composed of a material containing at least one of AlGaAs, AlGaAsP, AlInGaAs, AlInAs and AlInGaAsP.

3. The light emitting device as claimed in claim 1, wherein said electron blocking layer has an aluminum compositional ratio of 0.1 or larger.

4. The light emitting device as claimed in claim 1, wherein said tunnel junction is formed partially on the surface of said electron blocking layer,
   further comprising a semiconductor having said tunnel junction buried therein, and
   thereby configured as a buried tunnel junction structure in which current is confined at said tunnel junction.

5. The light emitting device as claimed in claim 1, further comprising:
   a resonator held between two reflecting mirrors;
   at least said active layer and said tunnel junction and said electron blocking layer reside in said resonator, and said electron blocking layer has a highest energy of the conduction band edge in said resonator.

6. The light emitting device as claimed in claim 1, wherein difference in energy of the conduction band edge between semiconductors composing said electron blocking layer and said active layer is 80 meV or larger.

7. The light emitting device as claimed in claim 1, wherein thickness of said electron blocking layer is 10 nm or larger.

8. The light emitting device as claimed in claim 1, wherein said electron blocking layer has an energy of the valence band edge lower than those of both adjacent layers, and further comprising:
   a layer step-wisely varied in the composition, between said electron blocking layer and each of both adjacent layers.

9. The light emitting device as claimed in claim 1, configured as a surface-emission-type laser device.

10. A light emitting device comprising:
    a tunnel junction having a p-type semiconductor an n-type semiconductor, and allowing electrons to pass from said p-type semiconductor to said n-type semiconductor under application of reverse bias voltage based on the tunneling effect, to thereby allow current to flow therethrough;
    an active layer; and
    an electron blocking layer positioned between said tunnel junction and said active layer,
    wherein said electron blocking layer has an energy of the conduction band edge higher than that of said active layer,
    a portion of said electron blocking layer or a portion of a layer disposed between said electron blocking layer and said tunnel junction, is composed of a material containing substantially no aluminum, and
    an area of said tunnel junction is smaller than that of said electron blocking layer.

* * * * *